(12) United States Patent
Danilak

(10) Patent No.: US 8,339,881 B2
(45) Date of Patent: *Dec. 25, 2012

(54) TECHNIQUES FOR INCREASING A LIFETIME OF BLOCKS OF MEMORY

(75) Inventor: Radoslav Danilak, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/042,242

(22) Filed: Mar. 7, 2011

(65) Prior Publication Data

US 2012/0060060 A1 Mar. 8, 2012

Related U.S. Application Data

(63) Continuation of application No. 11/942,631, filed on Nov. 19, 2007, now Pat. No. 7,903,486.

(51) Int. Cl.
*G11C 7/00* (2006.01)

(52) U.S. Cl. .................................. 365/201; 365/230.03

(58) Field of Classification Search .................. 365/201, 365/230.03
See application file for complete search history.

(56) References Cited

U.S. PATENT DOCUMENTS

| | | |
|---|---|---|
| 5,337,275 A | 8/1994 | Garner |
| 5,341,339 A | 8/1994 | Wells |
| 5,442,768 A | 8/1995 | Sudoh et al. |
| 5,485,595 A | 1/1996 | Assar et al. |
| 5,544,356 A | 8/1996 | Robinson et al. |
| 5,568,423 A | 10/1996 | Jou et al. |
| 5,568,626 A | 10/1996 | Takizawa |
| 5,621,687 A | 4/1997 | Doller |
| 5,768,182 A | 6/1998 | Hu et al. |
| 5,819,307 A | 10/1998 | Iwamoto et al. |
| 5,835,935 A | 11/1998 | Estakhri et al. |
| 5,881,229 A | 3/1999 | Singh et al. |
| 5,956,473 A | 9/1999 | Ma et al. |
| 5,963,970 A | 10/1999 | Davis |
| 6,000,006 A | 12/1999 | Bruce et al. |

(Continued)

FOREIGN PATENT DOCUMENTS

KR 20080090021 A 10/2008

(Continued)

OTHER PUBLICATIONS

Kumagai, Brian, Beekman, Scott, Choosing Flash memory, Apr. 2004, Hearst Electronic Products, 4 pgs., and as provided in an Apr. 2010 office action of U.S. Appl. No. 11/946,753.

(Continued)

*Primary Examiner* — Vu Le
*Assistant Examiner* — Han Yang
(74) *Attorney, Agent, or Firm* — PatentVentures; Bennett Smith; Korbin Van Dyke

(57) ABSTRACT

Techniques are described for increasing a lifetime of blocks of memory. In operation, respective life expectancy scores for each of the blocks are calculated based at least in part on a respective number of times each of the blocks is respectively erased, and further based at least in part on at least one other factor that affects the lifetime of the blocks. An order to write and recycle the blocks is determined, based at least in part on at least some of the respective lifetime expectancy scores. A total amount of the blocks that are erased and written is minimized while lifetime expectancy score variation between the blocks is equalized.

27 Claims, 5 Drawing Sheets

U.S. PATENT DOCUMENTS

| | | | |
|---|---|---|---|
| 6,085,248 A | 7/2000 | Sambamurthy et al. |
| 6,145,069 A | 11/2000 | Dye |
| 6,154,808 A | 11/2000 | Nagase et al. |
| 6,230,233 B1 | 5/2001 | Lofgren et al. |
| 6,256,232 B1 | 7/2001 | Chang et al. |
| 6,305,014 B1 | 10/2001 | Roediger et al. |
| 6,341,085 B1 | 1/2002 | Yamagami et al. |
| 6,347,051 B2 | 2/2002 | Yamagami et al. |
| 6,370,059 B2 | 4/2002 | Kato et al. |
| 6,405,295 B1 | 6/2002 | Bando |
| 6,539,453 B1 | 3/2003 | Guterman |
| 6,606,273 B1 | 8/2003 | Guo et al. |
| 6,694,402 B1 | 2/2004 | Mueller |
| 6,732,221 B2 | 5/2004 | Ban |
| 6,735,673 B2 | 5/2004 | Kever et al. |
| 6,831,865 B2 | 12/2004 | Chang et al. |
| 6,914,853 B2 | 7/2005 | Coulson |
| 6,925,523 B2 | 8/2005 | Engel et al. |
| 6,948,026 B2 | 9/2005 | Keays |
| 6,972,668 B2 | 12/2005 | Schauble et al. |
| 6,973,531 B1 | 12/2005 | Chang et al. |
| 6,985,992 B1 | 1/2006 | Chang et al. |
| 7,000,063 B2 | 2/2006 | Friedman et al. |
| 7,032,087 B1 | 4/2006 | Chang et al. |
| 7,035,967 B2 | 4/2006 | Chang et al. |
| 7,096,313 B1 | 8/2006 | Chang et al. |
| 7,103,732 B1 * | 9/2006 | Chang et al. ............ 711/156 |
| 7,120,729 B2 | 10/2006 | Gonzalez et al. |
| 7,222,214 B2 | 5/2007 | Belevich et al. |
| 7,224,604 B2 | 5/2007 | Lasser |
| 7,457,178 B2 | 11/2008 | Tu et al. |
| 7,555,575 B2 | 6/2009 | Kaneda |
| 7,595,796 B2 | 9/2009 | Ranganathan et al. |
| 7,653,778 B2 | 1/2010 | Merry et al. |
| 7,827,320 B1 | 11/2010 | Stevens |
| 2002/0008990 A1 | 1/2002 | Satoh et al. |
| 2002/0036939 A1 | 3/2002 | Tsai et al. |
| 2002/0042862 A1 | 4/2002 | Breternitz et al. |
| 2002/0059569 A1 | 5/2002 | Kondo |
| 2003/0120841 A1 | 6/2003 | Chang et al. |
| 2003/0135694 A1 | 7/2003 | Naffziger et al. |
| 2004/0030847 A1 | 2/2004 | Tremaine |
| 2004/0034765 A1 | 2/2004 | James |
| 2004/0064635 A1 | 4/2004 | Jung et al. |
| 2004/0135903 A1 | 7/2004 | Brooks et al. |
| 2005/0071562 A1 | 3/2005 | Adl-Tabatabai et al. |
| 2005/0138271 A1 | 6/2005 | Bernstein et al. |
| 2005/0228964 A1 | 10/2005 | Sechrest et al. |
| 2005/0281088 A1 | 12/2005 | Ishidoshiro et al. |
| 2005/0289389 A1 * | 12/2005 | Yamagami et al. ............ 714/8 |
| 2006/0080359 A1 | 4/2006 | Powell et al. |
| 2006/0174300 A1 | 8/2006 | Gu et al. |
| 2006/0178918 A1 | 8/2006 | Mikurak |
| 2006/0209684 A1 | 9/2006 | Bei |
| 2006/0212645 A1 | 9/2006 | Petersen et al. |
| 2006/0233010 A1 | 10/2006 | Li |
| 2007/0067366 A1 | 3/2007 | Landis |
| 2007/0101238 A1 | 5/2007 | Resnick et al. |
| 2007/0180186 A1 | 8/2007 | Cornwell et al. |
| 2007/0223579 A1 | 9/2007 | Bao |
| 2008/0005141 A1 | 1/2008 | Zheng et al. |
| 2008/0062761 A1 | 3/2008 | Tu et al. |
| 2008/0126685 A1 | 5/2008 | Danilak |
| 2008/0126719 A1 | 5/2008 | Danilak |
| 2008/0126720 A1 | 5/2008 | Danilak |
| 2008/0126724 A1 | 5/2008 | Danilak |
| 2008/0126891 A1 | 5/2008 | Danilak |
| 2008/0141054 A1 | 6/2008 | Danilak |
| 2008/0141055 A1 | 6/2008 | Danilak |
| 2008/0233798 A1 | 9/2008 | Yu et al. |
| 2008/0294813 A1 | 11/2008 | Gorobets |
| 2009/0094409 A1 | 4/2009 | Yeh et al. |
| 2009/0094447 A1 | 4/2009 | Yang et al. |
| 2009/0125645 A1 | 5/2009 | Prevost et al. |
| 2009/0129163 A1 | 5/2009 | Danilak |
| 2009/0132619 A1 | 5/2009 | Arakawa et al. |
| 2009/0132778 A1 | 5/2009 | Danilak |
| 2009/0300259 A1 | 12/2009 | Luo et al. |
| 2010/0017650 A1 | 1/2010 | Chin et al. |
| 2010/0037001 A1 | 2/2010 | Langlois et al. |
| 2010/0064096 A1 | 3/2010 | Weingarten et al. |
| 2011/0004722 A1 | 1/2011 | Jeddeloh |

FOREIGN PATENT DOCUMENTS

| | | |
|---|---|---|
| WO | 2008063647 A2 | 5/2008 |
| WO | 2008063647 A3 | 10/2008 |
| WO | 2009067138 A1 | 5/2009 |
| WO | 2009067139 A1 | 5/2009 |
| WO | 2009070196 A1 | 6/2009 |
| WO | 2011011295 A2 | 1/2011 |
| WO | 2011011295 A3 | 5/2011 |

OTHER PUBLICATIONS

PCT/US0724295 IPRP mailed on Oct. 22, 2009, 10 pgs.

PCT/US0724295 ISR mailed Aug. 8, 2008, 1 pg.

Lossless and lossy data compression, http://web.archive.org/web/20061 015213359/http://www.maximumcompression.com/lossless_vs_lossy.php, Oct. 15, 2006, 3 pgs., and as provided in an Apr. 2010 office action of U.S. Appl. No. 11/946,753.

R. Micheloni, L.Crippa, A, Marelli, "InsideNANDFlashMemories" Springer Science +Business Media B.V. 2010 ISBN 978-90-481-9430-8, pp. 38-43 and related footnote pp. 52-53, formatted as 4 sheets.

R. Micheloni, L.Crippa, A, Marelli, "InsideNANDFlashMemories" Springer Science +Business Media B.V. 2010 ISBN 978-90-481-9430-8, pp. 515-536, formatted as 12 sheets.

Chanik Park, Prakash Talawar, Daesik Won, MyungJin Jung, JungBeen Im, Suksan Kim and Youngjoon Choi, "A High Performance Controller for NAND Flash-based Solid State Disk (NSSD)," in Non-volatile Semiconductor Memory Workshop (NVSMW) Digest Technical Papers, 2006, pp. 17-20 (4 sheets).

K. Takeuchi, "NAND Successful as a Media for SSD" IEEE International Solid-State Circuits Conference Tutorial T7, 2008, rotated,pp. 1-81 (81 sheets).

Nov. 21, 2011 List of References Used in Art Rejections in Cases, 2 pgs.

"I-Cash: Intelligently Coupled Array of SSD and HDD" in the 17th IEEE International Symposium on High Performance Computer Architecture, 2011 (HPCA'11), San Antonio, TX, Feb. 2011. Jin Ren and Qing Yang, pp. 278-289.

\* cited by examiner ns application Ser. No. 11/942,631, filed Nov. 19,
TECHNIQUES FOR INCREASING A LIFETIME OF BLOCKS OF MEMORY

RELATED APPLICATIONS

The present application is a continuation of U.S. non-provisional application Ser. No. 11/942,631, filed Nov. 19, 2007, now U.S. Pat. No. 7,903,486, and is incorporated by reference in entirety for all purposes.

FIELD OF THE INVENTION

The present invention relates to memory, and more particularly to memory having a finite lifetime.

BACKGROUND

Memory is one of the most limiting aspects of performance of modern enterprise computing systems. One limiting aspect of memory is the fact that many types of memory exhibit a limited lifetime. For example, a lifetime of non-volatile memory such as flash is reduced each time it is erased and re-written. Over time and thousands of erasures and re-writes, such flash memory may become less and less reliable.

One common prior art technique for reducing the reduction of memory lifetime is wear leveling. Wear leveling allows for blocks within a storage device to be erased and written a roughly equal number of times. This avoids situations where one block is more frequently used, reaches an end of life, and must stop being used. This reduces the storage capacity of the entire device. Although the storage devices may have spare blocks, the spare blocks are exhausted and a memory capacity of device drops such that the storage device may not be used.

Memory vendors often guarantee a life expectancy of a certain percentage of memory. For example, a flash memory vendor may guarantee that after 100,000 program and erase cycles (i.e. endurance), less than 1% of blocks will be unusable based on exceeding error correction requirements. In this case, the error correction requirements may be set to correct a single bit error per 512 bytes for the flash device. Some recently developed devices have a much lower endurance. These devices require a much larger error correction requirement.

Furthermore, the lifetimes of memory blocks may vary. Consequently, using wear leveling, where a number of program erase cycles are leveled, a storage device may reach an end of life when only a specified percentage blocks are bad (1% for example). However, most blocks included in the storage device may still be functional.

There is thus a need for addressing these and/or other issues associated with the prior art.

SUMMARY

A system, method, and computer program product are provided for increasing a lifetime of a plurality of blocks of memory. In operation, at least one factor that affects a lifetime of a plurality of blocks of memory is identified. Additionally, the plurality of blocks to write is selected, based on the at least one factor.

DETAILED DESCRIPTION

Figure 1:
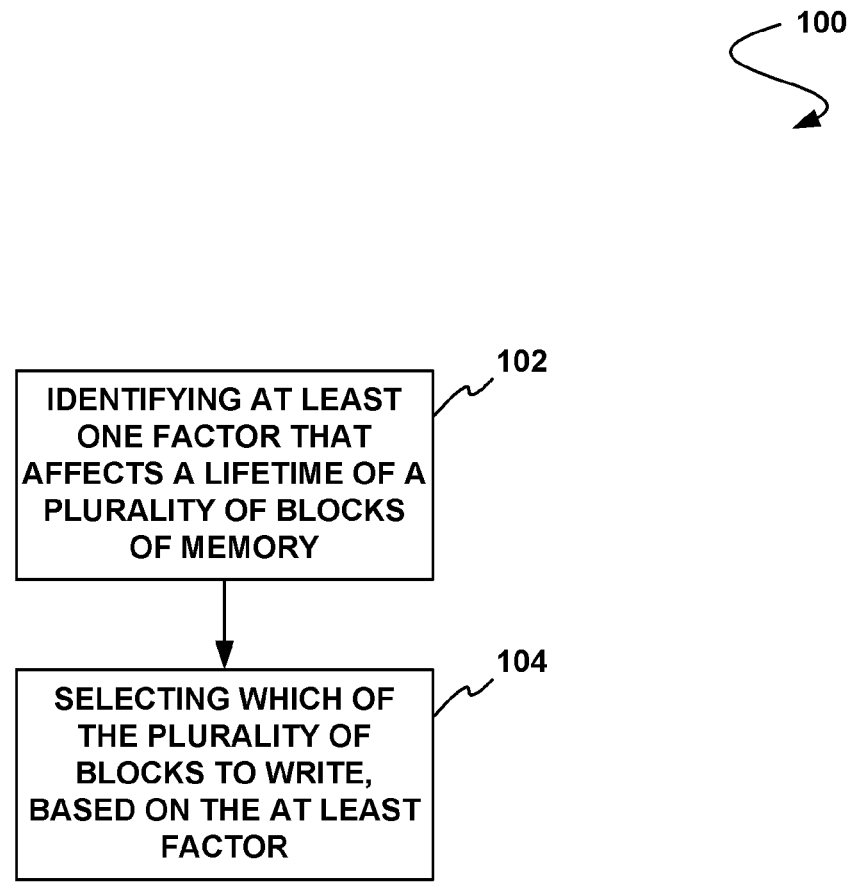
FIG. 1 shows a method for increasing a lifetime of a plurality of blocks of memory, in accordance with one embodiment.

FIG. 1 shows a method 100 for increasing a lifetime of a plurality of blocks of memory, in accordance with one embodiment. As shown, at least one factor that affects a lifetime of a plurality of blocks of memory is identified. See operation 102. Additionally, the plurality of blocks to write is selected, based on the at least one factor. See operation 104.

In the context of the present description, the lifetime of the memory may include any duration during which the memory exhibits any desired degree of usability. For example, in various embodiments, such lifetime may include, but is certainly not limited to a desired lifetime, an actual lifetime, an estimated lifetime, etc. Further, the degree of usability may refer to any usability-related parameter such as a percentage of components (e.g. blocks, cells, etc.) that are still operational, a reliability of the memory or components thereof, and/or any other parameter for that matter.

Additionally, in various embodiments, the memory may include, but is not limited to, mechanical storage devices (e.g. disk drives, etc.), solid state storage devices (e.g. dynamic random access memory (DRAM), flash memory, etc.), and/or any other storage device. In the case that the memory includes flash memory, the flash memory may include, but is not limited to, single-level cell (SLC) devices, multi-level cell (MLC) devices, NOR flash memory, NAND flash memory, MLC NAND flash memory, SLC NAND flash memory, etc. In one embodiment, the nonvolatile memory device may include at least one of a single-bit per cell NOR flash memory, a multi-bit per cell NOR flash memory, a single-bit per cell NAND flash memory, and a multi-bit per cell NAND flash memory.

Furthermore, in the context of the present description, the factor may include any factor that may affect a lifetime of memory blocks either directly, or indirectly. For example, in various embodiments the factors may include, but are not limited to, a number of errors (e.g. detected, corrected, etc.) during a read operation involving at least one of the blocks of memory, a duration between a program operation and read operation involving at least one of the blocks of memory, a number of times at least one of the blocks of memory is erased, a duration required to erase at least one of the blocks of memory, a duration required to program at least one of the blocks of memory, a number of retries required to program at least one of the blocks of memory, a number of intervening reads of a page of at least one of the blocks of memory, a number of intervening reads in a neighboring page, structure and organization of memory, and/or any other factors that meet the above definition. As an option, a history of use of the blocks of memory may be stored. In this case, the history of use may be utilized to determine the factor.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
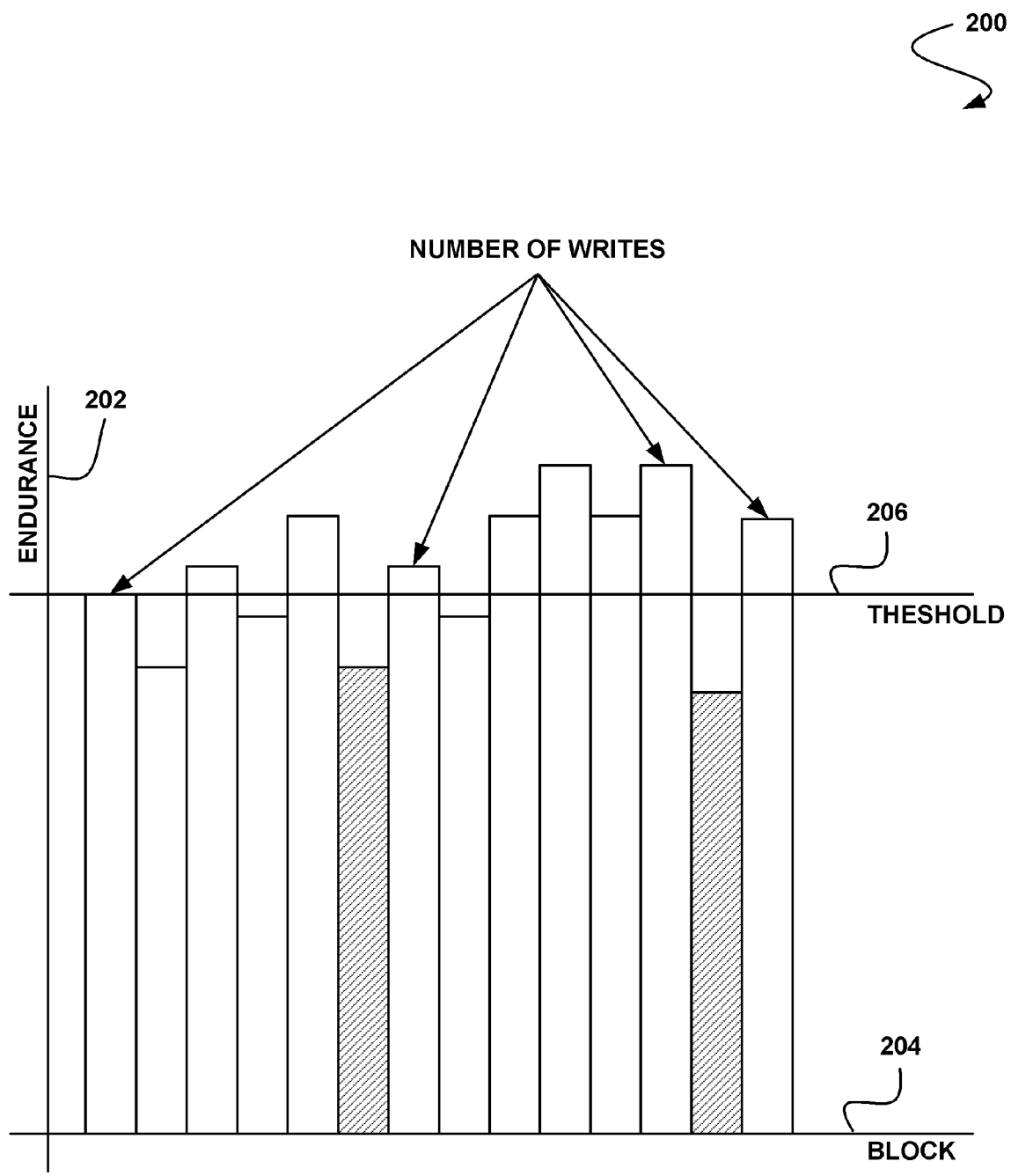
FIG. 2 shows a technique for increasing a lifetime of a plurality of blocks of memory, in accordance with another embodiment.

FIG. 2 shows a technique 200 for increasing a lifetime of a plurality of blocks of memory, in accordance with another embodiment. As an option, the present technique 200 may be implemented in the context of the details of FIG. 1. Of course, however, the technique 200 may be implemented in any desired environment. It should also be noted that the aforementioned definitions may apply during the present description.

As shown, an endurance 202 of a plurality of memory blocks 204 may be monitored. In this case, the bars in FIG. 2 represent the number of writes for a particular block 204. In the context of the present description, the endurance 202 refers to the number of write and erase cycles for each memory block 204. Thus, the endurance 202 corresponds to a usage of the memory blocks 204. In one embodiment, the number of writes and/or erases may be monitored and logged.

By monitoring the number of writes of the blocks 204, it may be determined which blocks have been utilized more frequently. In one embodiment, the monitoring may be used to determine whether the number of writes for any of the blocks 204 has exceeded a threshold 206. Additionally, such monitoring may allow an equalization of the usage such that when the number of writes for certain blocks reach the threshold 206, other blocks below the threshold 206 may be utilized for writes. For example, an order on which blocks are written and recycled may be changed to minimize any difference in endurance values between blocks.

In operation, at least one factor that affects a lifetime of the plurality of blocks of memory 204 may be identified and/or monitored. A plurality of blocks to write may then be selected based on the at least one factor. In various embodiments, there may be multiple factors indicating a state of the blocks 204 from a lifetime perspective. In one embodiment, the factor may include a number of corrected errors associated with each of the blocks 204. Such corrected errors may correspond to a reading of the data, for example.

In various cases, the factor may be impacted by a plurality of other factors. For example, the number of corrected errors may be impacted by how much time has lapsed from a program operation to a read, and by how many reads were executed. Additionally, a number of times a block is erased and programmed may also impact the number of errors corrected.

Of course, many other factors may also impact the number of errors corrected. In various embodiments, the factors may correspond to a period of time of usage of the blocks 204, a frequency of writes, a rate of the operations, a total permitted number of the operations, and a duration of the lifetime, etc. Of course, such exemplary aspects are set forth for illustrative purposes only as the factor may correspond to any aspect that may affect a life expectancy of a block of memory.

In one embodiment, a score may be utilized as to determine whether to change the order of which the blocks 204 are written and recycled. For example, each block 204 may have a corresponding score function that is based on at least one factor. The score function may be utilized to determine a score for each of the blocks 204.

This score may be utilized to minimize a difference in values between score functions of the blocks 204. As an option, the score may be based on one factor that affects a lifetime of the blocks 204. As another option, the score may be based on a plurality of factors that affect a lifetime of the blocks 204.

For example, in the case of two memory blocks, one memory block may have a score over the threshold 206 and one may have a score below the threshold 206. In this case, each of the scores may correspond to at least one factor that affects the lifetime of the blocks. It should be noted that, the scores may correspond to any number of factors, as noted above.

In one embodiment, the scores may be indicative of a value corresponding to at least one factor relating to a life expectancy of the blocks. In this case, the difference in the values may reflect a difference in a lifetime expectancy of the blocks. Thus, the two blocks may be equalized.

In one embodiment, the equalization may include utilizing (e.g. writing) the block below the threshold 206 while the block that is above the threshold 206 is not utilized. This may occur until a point when the two blocks correspond to equal or near equal values. At that point, the threshold 206 may be increased and either memory block may be utilized.

Initially all blocks 204 may be below the threshold 206. When a block exceeds the threshold 206, it may be labeled, or otherwise identified as a block above the threshold 206. The blocks 204 under the threshold 206 may then be utilized until they reach or exceed the threshold 206.

This may continue until all blocks 204 below the threshold 206 are exhausted. At this point, a new threshold may be set such that all existing blocks 204 are below the new threshold. This may repeat throughout the lifetime of the blocks 204.

As an option, a count percentage of free space may be utilized during the equalization the variation between the blocks 204, in order to minimize a total amount of blocks 204 that are erased and written. Additionally, various other techniques may be utilized to minimize a total amount blocks that are erased and written in conjunction with equalizing the variation between the blocks (i.e. block reclamation). Furthermore, various other equalizing techniques may be utilized to equalize the variation between the blocks 204.

In one embodiment, multiple memory modules may be utilized in a system. In this case, the memory modules may include memory modules with different lifetimes. As such, the total memory lifetime of the system may be up to the sum of the lifetime of the memories, as opposed to being limited to a memory module with the minimum lifetime.

In one embodiment, a lifetime estimator module may serve to receive commands communicated to a controller of a system via a storage bus. The lifetime estimator module may compute an estimated lifetime assuming that the commands received through the bus were executed. In one embodiment, the lifetime estimator may be utilized to monitor the number of writes and/or other factors affecting the lifetime of the memory blocks 204. Strictly as an option, the lifetime estimator module may be utilized to set the threshold 206.

Of course, the threshold 206 may be set using a variety of techniques. In one embodiment, the threshold 206 may be a pre-determined threshold. In another embodiment, the threshold 206 may be set dynamically. As an option, the threshold may correlate directly to a lifetime (e.g. expected, desired, etc.) of a device associated with at least one of the memory blocks 206.

In one embodiment, an intra-storage device redundancy capability may be utilized for reducing cost and improving performance. In such embodiment, data may be moved between the individual storage devices, based on any factor associated with a lifetime thereof. For instance, a situation may involve a first one of the storage devices including a set of data that is more frequently overwritten with respect to the data of a second one of the storage devices. In such case, after threshold of at least one factor associated with lifetime is exceeded, such data may be moved from the first storage device to the second storage device, and henceforth the first storage device or one or more blocks/modules thereof may be used to store less-frequently written data or retired from further use.

To this end, storage device lifetime may be distributed appropriately to avoid one storage device or a portion of a storage device from failing at a point in time that is vastly premature with respect to other storage devices of the group. Of course, the present technique may be applied not only among different storage devices, but also portions thereof. To this end, the lifetime of any memory components may be managed in such a manner.

Figure 3:
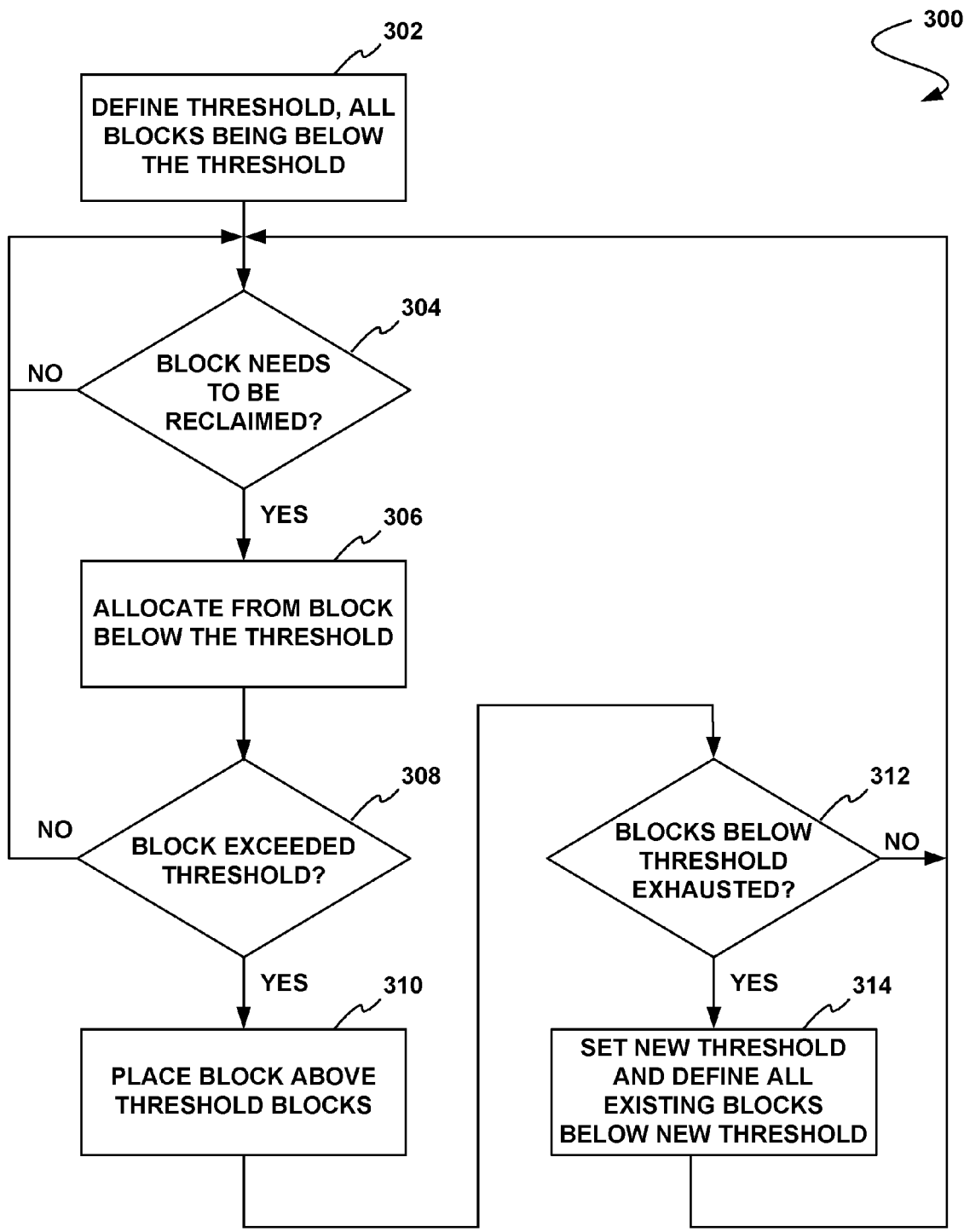
FIG. 3 shows a method for increasing a lifetime of a plurality of blocks of memory, in accordance with another embodiment.

FIG. 3 shows a method 300 for increasing a lifetime of a plurality of blocks of memory, in accordance with another embodiment. As an option, the present method 300 may be implemented in the context of the functionality of FIGS. 1-2. Of course, however, the method 300 may be carried out in any desired environment. It should also be noted that the aforementioned definitions may apply during the present description.

As shown, a threshold is defined such that all blocks of memory are below the threshold. See operation 302. In one embodiment, the threshold may correspond to a usage of the blocks. For example, as blocks are used a value of usage associated with the blocks may approach the threshold. In another embodiment, the threshold may correspond to at least one other factor associated with a life expectancy of the set of blocks.

For example, the threshold may correspond to a number of corrected errors for the blocks. In this case, as blocks are used a value the number of corrected errors associated with the blocks may approach the threshold. Of course, the threshold may correspond to any number of factors affecting the lifetime of the blocks.

Once an initial threshold is identified which the blocks are below, it is determined whether a block needs to be reclaimed. See operation 304. For example, if factors indicate that a block or group of blocks is above the threshold or have been used disproportionately to other blocks, it may be determined that the block or blocks need to be reclaimed.

In the context of the present description, block reclaiming, which may be triggered by garbage collection, read disturbs, scrubbing, number of corrected errors, or other event, refers to equalizing a variation between block, based on at least one factor. For example, in various embodiments the block reclaiming may include equalizing a variation between the blocks based on a number of errors detected during a read/write, a number of errors corrected during a read/write, a length of time to erase a block, a length of time for a block to program, a number of entries utilized during programming, a number of intervening reads of a page, a number of intervening reads in a neighboring page, a number of erases and program cycles of a block, and/or any other factors.

If it is determined that a block needs to be reclaimed, blocks in a block set below the threshold are allocated to be written. See operation 306. For example, blocks below a threshold may be utilized in a memory operation as opposed to the block or blocks in a block set which is above the threshold.

Once block(s) in a block set below the threshold are allocated to be written, it is then determined whether any blocks exceed the threshold. See operation 308. For example, the blocks in the block set below the threshold may be written until it is determined that a block exceeds the threshold.

If it is determined that a block has exceeded the threshold, the block may be placed into the set of blocks corresponding to blocks over the threshold. See operation 310. If the block has not exceeded the threshold, the block may remain in the block set below the threshold and may continue to be utilized.

It is then determined whether all of the blocks below the threshold are exhausted. See operation 312. In other words, it is determined whether all blocks in the set of blocks corresponding to blocks below the threshold have been included in the set of blocks corresponding to blocks above the threshold.

If all blocks below the threshold have been exhausted, a new threshold is set and all existing blocks are defined to be below the new threshold. See operation 314. Once a new threshold has been set, it is again determined whether blocks need to be reclaimed. As an option, this may continue over the lifetime of the memory blocks.

It should be noted that the new and the initial thresholds may be set based on various criteria. For example, the threshold may be set based on an expected usage of the blocks. In one embodiment, the threshold may be a pre-determined threshold. In another embodiment, the threshold may be determined based on the memory block usage.

Figure 4:
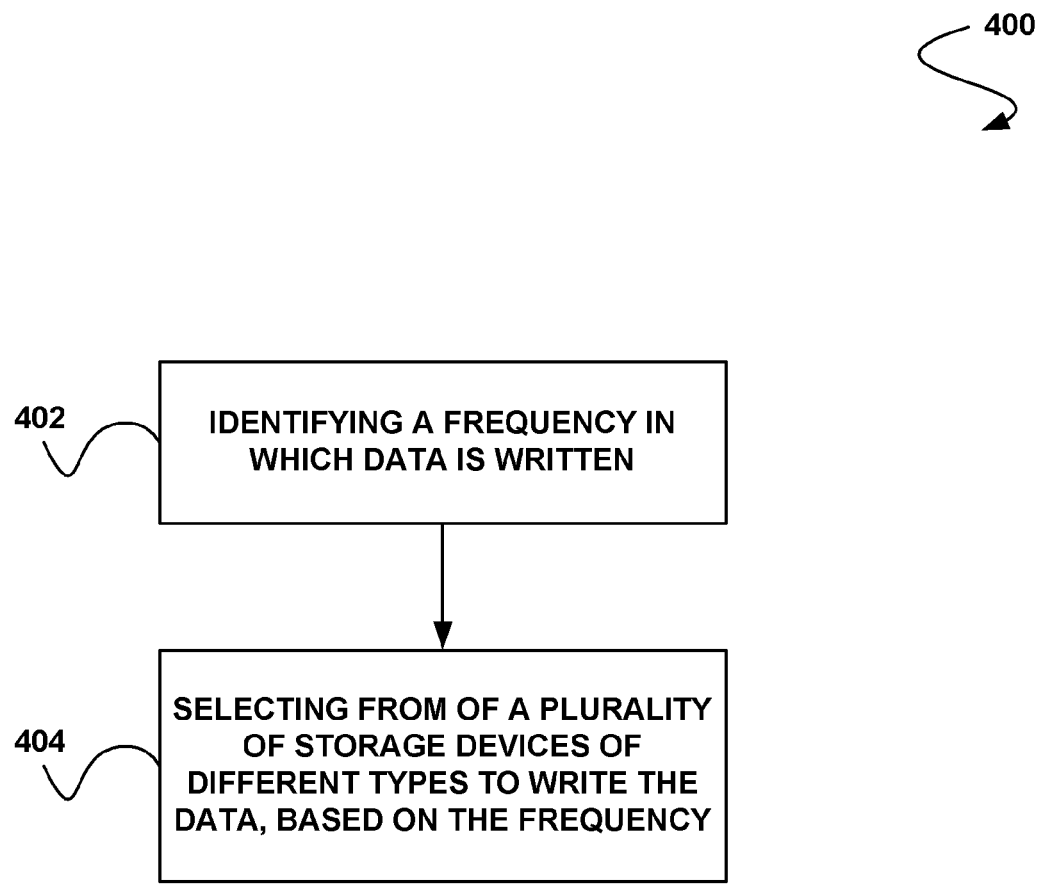
FIG. 4 shows a method for writing data to different storage devices based on a write frequency, in accordance with one embodiment.

FIG. 4 shows a method 400 for writing data to different storage devices based on a write frequency, in accordance with one embodiment. As an option, the present method 400 may be implemented in the context of the functionality and architecture of FIGS. 1-3. Of course, however, the method 400 may be carried out in any desired environment. It should also be noted that the aforementioned definitions may apply during the present description.

As shown, a frequency in which data is written is identified. See operation 402. Additionally, a plurality of storage devices of different types are selected from to write the data, based on the frequency. See operation 404.

In one embodiment, the selection may be based on a threshold. For example, if the frequency in which data is written exceeds a threshold, a certain storage device may be selected to write the data. As an option, the different types of storage devices may include an SLC and an MLC device, an MLC and MLC with different endurance, SLC and DRAM, MLC and DRAM. Of course, in various other embodiments, the different types of storage devices may include any number of devices, including a variety of different types of memory.

In another embodiment, at least two different types of memory may be integrated in one device. For example, flash MLC and SLC memory may be combined on one device. As another example, two different types of flash MLC may be integrated in one device. In yet another example, a mix of memory types in one device may be determined programmatically. In one case, a portion of the storage device associated with SLC flash memory may be determined and a portion of the storage device associated with the MLC flash memory may be determined.

As a specific example, it may be determined that data from a particular application or program is written with a high frequency. In this case, an SLC device may be selected to write the data. On the other hand, it may be determined that data from a particular application or program, or particular location of disk, or from particular access pattern are written with a low frequency. In this case, an MLC device may be selected to write the data. Of course, this is merely an example, as any number of devices may be selected based on the identified frequency.

In one embodiment, a lifetime estimator module may serve to receive commands communicated to a controller of a system via a storage bus. The lifetime estimator module may monitor a frequency as well as computing an estimated lifetime assuming that the command(s) received through the bus was executed. Of course, the frequency may be determined in a variety of ways and is not limited to being identified by the lifetime estimator module.

It should be noted that, in various embodiments, the memory mentioned in the foregoing embodiments may include a mechanical storage device (e.g. a disk drive including a SATA disk drive, a SAS disk drive, a fiber channel disk drive, IDE disk drive, ATA disk drive, CE disk drive, USB disk drive, smart card disk drive, MMC disk drive, etc.) and/or a non-mechanical storage device (e.g. semiconductor-based, etc.). Such non-mechanical memory may, for example, include volatile or non-volatile memory. In various embodiments, the nonvolatile memory device may include flash memory (e.g. single-bit per cell NOR flash memory, multi-bit per cell NOR flash memory, single-bit per cell NAND flash memory, multi-bit per cell NAND flash memory, multi-level and/or multi-bit per cell NAND flash, large block flash memory, resistive memory, phase change memory, magnetic memory, etc). While various examples of memory are set forth herein, it should be noted that the various principles may be applied to any type of memory a lifetime for which may be reduced due to various operations being performed thereon.

Figure 5:
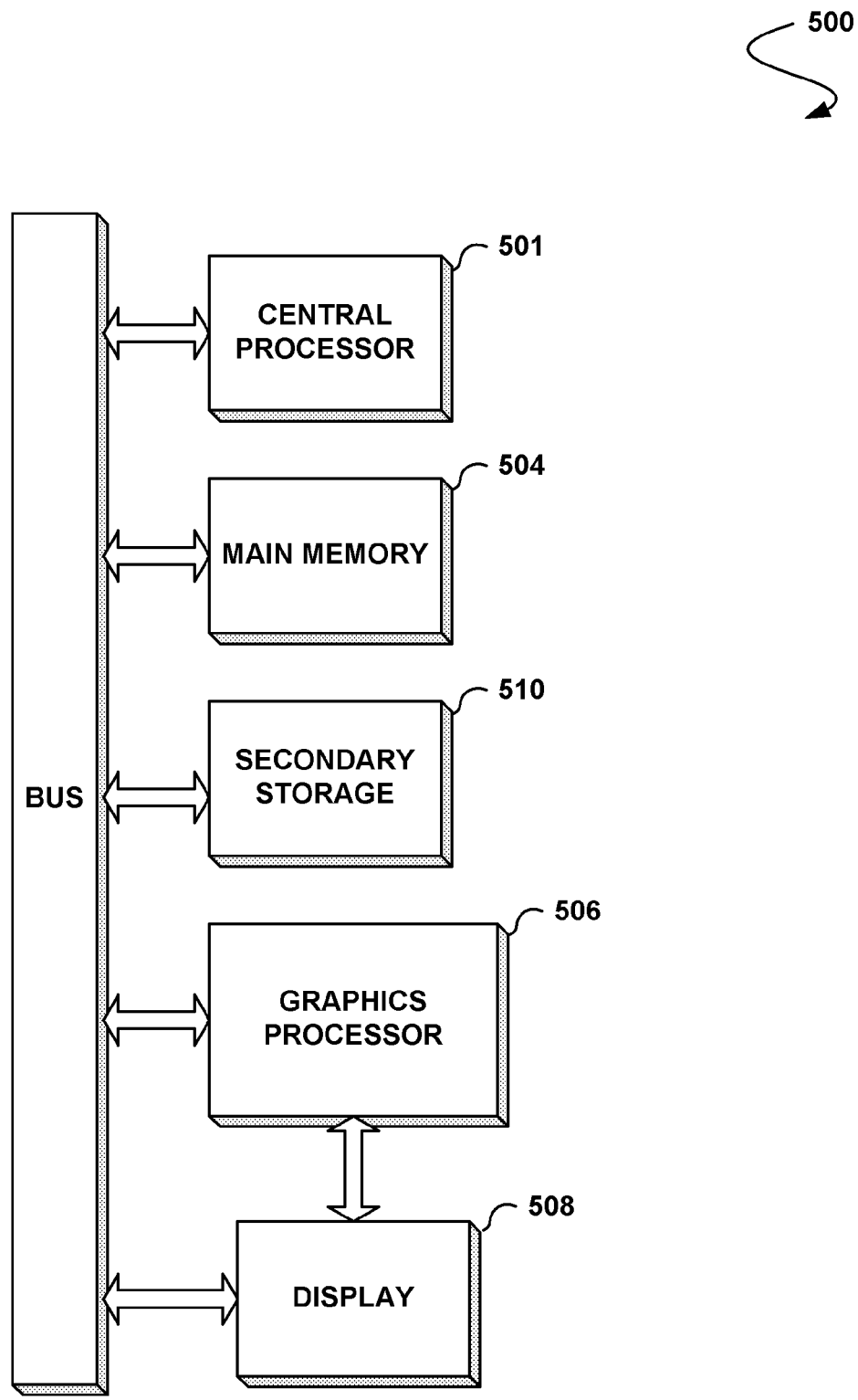
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. For example, the exemplary system 500 may represent the computer set forth in some of the previous embodiments. Still yet, the various apparatuses set forth above may even be a component of the system 500.

As shown, a system 500 is provided including at least one host processor 501 which is connected to a communication bus 502. The system 500 also includes a main memory 504. Control logic (software) and data are stored in the main memory 504 which may take the form of random access memory (RAM).

The system 500 may also include a graphics processor 506 and a display 508, i.e. a computer monitor. The system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage module in a well known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, the architecture and/or functionality of the various previous figures may be implemented in the context of the host processor 501, graphics processor 506, secondary storage 510, an integrated circuit (not shown) that is capable of at least a portion of the capabilities of both the host processor 501 and the graphics processor 506, a chipset (i.e. a group of integrated circuits designed to work and be sold as a module for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, lap-top computer, and/or any other type of logic. Still yet, the system 500 may take the form of various other devices including, but not limited to a personal digital assistant (PDA) device, a mobile phone device, a television, etc.

Further, while not shown, the system 500 may be coupled to a network [e.g. a telecommunications network, local area network (LAN), wireless network, wide area network (WAN) such as the Internet, peer-to-peer network, cable network, etc.] for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
calculating a respective lifetime expectancy score for each of a plurality of blocks of a memory based at least in part on a respective number of times each of the blocks is respectively erased and further based at least in part on at least one other factor that affects a lifetime of the blocks;
determining an order to write and recycle the blocks, based at least in part on at least some of the respective lifetime expectancy scores; and
wherein a total amount of the blocks that are erased and written is minimized while lifetime expectancy score variation between the blocks is equalized.

2. The method of claim 1, wherein the at least one other factor comprises a respective number of errors during a respective read operation involving each of the blocks.

3. The method of claim 2, wherein the errors are detected errors.

4. The method of claim 2, wherein the errors are corrected errors.

5. The method of claim 1, wherein the at least one other factor comprises a respective duration between a respective program operation and a respective read operation involving each of the blocks.

6. The method of claim 1, wherein the at least one other factor comprises a respective duration required to respectively erase each of the blocks.

7. The method of claim 1, wherein the at least one other factor comprises a respective duration required to respectively program each of the blocks.

8. The method of claim 1, wherein the at least one other factor comprises a respective number of retries required to respectively program each of the blocks.

9. The method of claim 1, wherein the at least one other factor comprises a respective number of intervening reads of a page associated with each of the blocks.

10. The method of claim 1, wherein the at least one other factor comprises a respective number of intervening reads in a neighboring page associated with each of the blocks.

11. The method of claim 1, wherein first and second ones of the blocks have respective first and second estimated lifetimes, the first estimated lifetime is longer than the second estimated lifetime, and further comprising writing the first block before writing the second block.

12. The method of claim 11, wherein the respective lifetime expectancy score for the second block is above a threshold value established for lifetime expectancy scores.

13. The method of claim 12, wherein the respective lifetime expectancy score for the first block is below the threshold value.

14. The method of claim 1, wherein the memory includes a mechanical storage device.

15. The method of claim 1, wherein the memory includes a nonvolatile memory device.

16. The method of claim 15, wherein the nonvolatile memory device includes at least one of a single-bit per cell NOR flash memory, a multi-bit per cell NOR flash memory, a single-bit per cell NAND flash memory, and a multi-bit per cell NAND flash memory.

17. The method of claim 1, further comprising storing a history of use of the blocks.

18. A tangible computer readable medium having a set of instructions stored therein which when executed by a processing element causes the processing element to perform functions comprising:
    calculating a respective lifetime expectancy score for each of a plurality of blocks of a memory based at least in part on a respective number of times each of the blocks is respectively erased and further based at least in part on at least one other factor that affects a lifetime of the blocks;
    determining an order to write and recycle the blocks, based at least in part on at least some of the respective lifetime expectancy scores; and
    wherein a total amount of the blocks that are erased and written is minimized while lifetime expectancy score variation between the blocks is equalized.

19. The tangible computer readable medium of claim 18, wherein the at least one other factor comprises a respective number of corrected errors during a respective read operation involving each of the blocks.

20. The tangible computer readable medium of claim 18, wherein the at least one other factor comprises a respective duration between a respective program operation and a respective read operation involving each of the blocks.

21. The tangible computer readable medium of claim 18, wherein the at least one other factor comprises a respective duration required to respectively erase each of the blocks.

22. The tangible computer readable medium of claim 18, wherein the at least one other factor comprises one or more of
    a respective duration required to respectively program each of the blocks, and
    a respective number of retries required to respectively program each of the blocks.

23. The tangible computer readable medium of claim 18, wherein the at least one other factor comprises one or more of
    a respective number of intervening reads of a page associated with each of the blocks, and
    a respective number of intervening reads in a neighboring page associated with each of the blocks.

24. The tangible computer readable medium of claim 18, wherein the memory includes a nonvolatile memory device.

25. The tangible computer readable medium of claim 24, wherein the nonvolatile memory device includes at least one of a single-bit per cell NOR flash memory, a multi-bit per cell NOR flash memory, a single-bit per cell NAND flash memory, and a multi-bit per cell NAND flash memory.

26. A system comprising:
    means for calculating a respective lifetime expectancy score for each of a plurality of blocks of a memory based at least in part on a respective number of times each of the blocks is respectively erased and further based at least in part on at least one other factor that affects a lifetime of the blocks;
    means for determining an order to write and recycle the blocks, based at least in part on at least some of the respective lifetime expectancy scores; and
    wherein a total amount of the blocks that are erased and written is minimized while lifetime expectancy score variation between the blocks is equalized.

27. The system of claim 26, wherein the at least one other factor comprises a respective number of corrected errors during a respective read operation involving each of the blocks.

* * * * *